United States Patent [19]

Hoge et al.

[11] 3,745,382

[45] July 10, 1973

[54] SOLID STATE TIMER CIRCUIT FOR CONTROLLING THE ENERGIZATION TIME OF A LOAD

[75] Inventors: Henri H. Hoge, Baltimore; Lawrence S. Nickel, Cockeysville, both of Md.

[73] Assignee: Rhomega Systems, Inc., Cockeysville, Md.

[22] Filed: Feb. 18, 1972

[21] Appl. No.: 227,362

[52] U.S. Cl......... 307/293, 307/247 A, 307/252 B, 307/252 N, 307/284

[51] Int. Cl......... H03k 17/26

[58] Field of Search........ 307/252 B, 252 N, 307/252 W, 293, 284, 305; 317/141 S, 148.5 B

[56] References Cited

UNITED STATES PATENTS

| | | | |
|---|---|---|---|
| 3,346,874 | 10/1967 | Howel | 307/252 B |
| 3,594,591 | 7/1971 | Laupman | 307/252 B |
| 3,638,043 | 1/1972 | Laupman | 307/252 B |
| 3,644,754 | 2/1972 | Dosch | 307/252 N |
| 3,500,164 | 3/1970 | Burkhardt et al. | 307/293 X |

*Primary Examiner*—Stanley D. Miller, Jr.
*Attorney*—Colton & Stone

[57] ABSTRACT

The solid state electronic timer controls the time of load energization with a bidirectional solid state switching device. Upon the operation of a timer actuating unit, a large capacitor is charged to provide a charge for a small capacitor in a relaxation oscillator circuit. The relaxation oscillator output is supplied to gate the bidirectional solid state switching device. Since the current necessary to operate the relaxation oscillator is small, timing cycles in the range of many minutes are provided without resort to physically large capacitors.

12 Claims, 2 Drawing Figures

SOLID STATE TIMER CIRCUIT FOR CONTROLLING THE ENERGIZATION TIME OF A LOAD

BACKGROUND OF THE INVENTION

Figure 1:
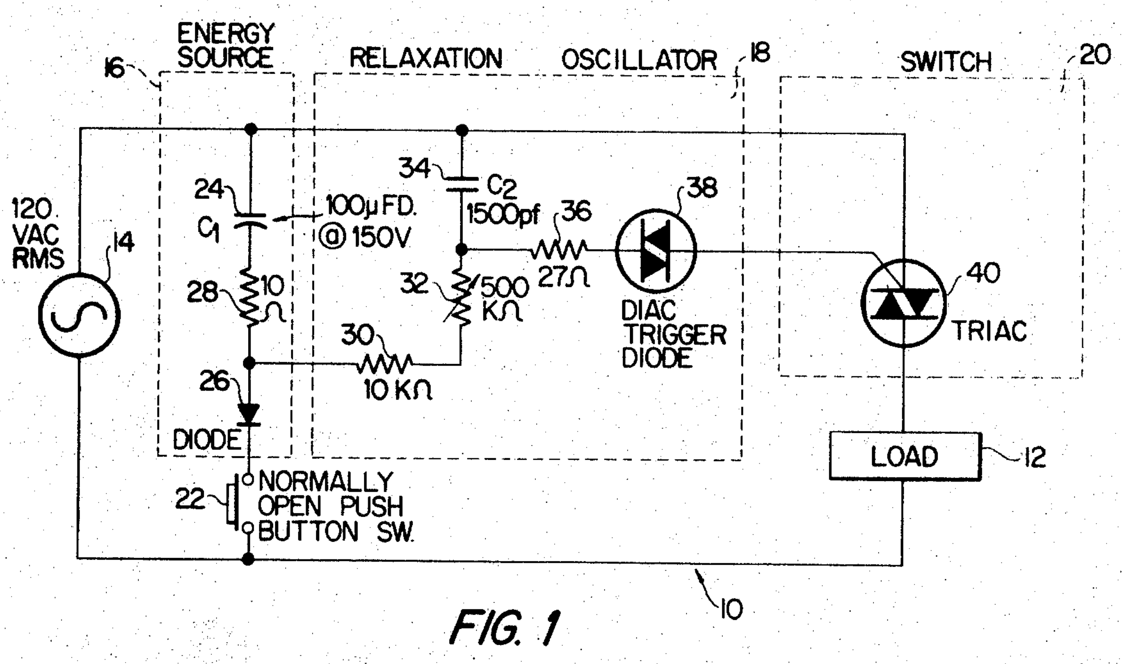

Simple, compact, solid state timing circuits are in great demand for use in timing the operation of various electrical devices such as appliances, lights, motors, etc. It is normally desirable for such circuits to be of minimal cost and to be adapted for operation in a compact space. Thus the circuits must be simple in form but capable of providing timing cycles in the range of many minutes.

Conventional solid state timing circuits which meet the requirements of simplicity, economy, and size desirable for small electrical apparatus timing units generally employ a storage capacitor which continuously provides a stored charge to the gate of a semiconductor switching device. Thus the time during which the semiconductor switching device provides energization to a load from a power source is determined by the time period during which the stored charge on the capacitor is sufficient to gate the semiconductor switching device. In instances where a storage capacitor continuously provides gate drive to a semi-conductor switching device, physically large capacitors are required to provide extended timing cycles.

Extremely complex load control circuits have been developed wherein timed control of an oscillator is employed to gate a solid state switching device which provides load energization. In such circuits, complex transistorized or other solid state timing units are normally employed for oscillator control. U.S. Pat. Nos. 3,553,495 to Shaughnessy, 3,597,637 to Vandemore, and 3,543,137 to Kubler illustrate such circuits.

Also, devices have been developed for controlling a load by varying the phase relationship between gating pulses applied to gate a semiconductor switching device controlling the energization of a load and an alternating current source which provides such energization. In such circuits, an oscillator device is employed to vary the phase relationship between the alternating current source and the gating pulses for the semiconductor switching unit, and U.S. Pat. No. 3,360,713 to Howell provides a good illustration of a circuit of this type.

No simple, compact semiconductor timer circuit has been developed which effectively employs the use of the charge on a storage capacitor to control the timed energization of a load over a substantial timing cycle.

A primary object of the present invention is to provide a novel and improved electronic timer of simple, compact construction which is adapted to provide a wide range of timing cycles.

Another object of this invention is to provide a novel and improved timer circuit adapted to operate from a stored charge on a storage capacitor and to maximize the use of such stored charge.

A further object of the present invention is to provide a novel and improved semiconductor timer circuit which employs a relaxation oscillator operable from the stored charge on a storage capacitor to control the gating of a bidirectional semiconductor switching unit.

Another object of the present invention is to provide a novel and improved semiconductor timer circuit including a relaxation oscillator operable from the charge stored on a storage capacitor to gate a bidirectional semiconductor switching device wherein the nonlinear portion of the discharge cycle of the capacitor is eliminated.

A still further object of the present invention is to provide a novel and improved semiconductor timer circuit which employs a capacitor charge to operate a relaxation oscillator for gating a semiconductor switching device and which is adapted to eliminate erratic operation of the semiconductor switching device as the charge on the storage capacitor decays.

Figure 2:
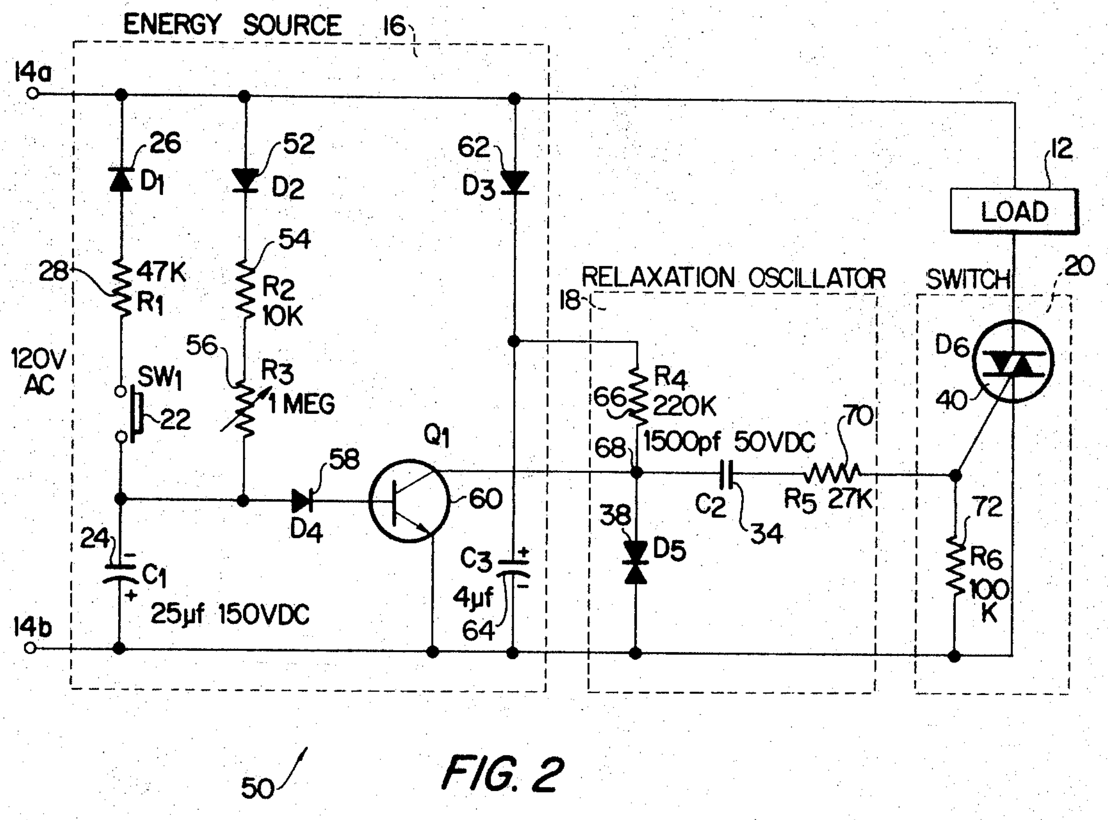

These and other objects of the present invention will become readily apparent upon a consideration of the following specification taken in conjunction with the accompanying drawings in which:

FIG. 1 is a circuit diagram of a first embodiment of the electronic timer circuit of the present invention; and FIG. 2 is a circuit diagram of a second embodiment of the electronic timer circuit of the present invention.

Referring now to FIG. 1, the electronic timer of the present invention indicated generally at 10 is connected to control the energization of a load 12 by an alternating current source 14. This alternating current source constitutes a conventional 60-cycle 120-volt source.

Basically, the timer 10 is formed by three operating sections connected between the alternating current source 14 and the load 12; namely, an energy source 16, a relaxation oscillator 18, and a switching unit 20. The timer is activated by momentarily closing a normally open pushbutton switch 22 which completes a circuit from the alternating current source 14 to the energy source 16. Momentary closure of the pushbutton switch permits a storage capacitor 24 to charge through a diode 26 and a current limiting resistor 28. This storage capacitor is a relatively large storage capacitor and, for example, may constitute a 100 micro farad capacitor. The storage capacitor, which with the diode 26 and current limiting resistor 28 forms the energy source 16 will be charged to a minus DC voltage (i.e., minus 150 volts DC) with respect to the AC line extending from the alternating current source 14. It will be noted that the energy source 16 is connected across this AC line.

The relaxation oscillator 18 is connected to the energy source 16 by a resistor 30, one terminal of which is connected between the diode 26 and the current limiting resistor 28. This resistor 30 is also connected in series with a variable resistor or potentiometer 32 which is in turn connected to a small capacitor 34. The small capacitor 34 which, for example, may be a 1,500 pico farad capacitor, is connected between the variable resistor 32 and one side of the alternating current source 14.

A resistor 36 having one terminal which is connected between the variable resistor 32 and the capacitor 34 and a Diac trigger diode 38 connected to the resistor 36 complete the relaxation oscillator 18. The output of the Diac 38 is connected to the gate electrode of a bidirectional semiconductor switching device 40, such as a Triac, which forms the switch 20. Triac 40 is connected in series with the load 12 across the alternating current voltage source 14.

In the operation of the electronic timer 10 of FIG. 1, momentary closure of the normally open pushbutton switch 22 causes the storage capacitor 24 to charge through the diode 26 and the current limiting resistor 28 to a negative DC value with respect to the AC line.

The relaxation oscillator 18 immediately begins firing at a frequency many times the rate of the 60-cycle per second frequency of the AC line as the small capacitor 34 is rapidly charged from the storage capacitor 24. The current required to operate the relaxation oscillator is small, but the small capacitor 34 stores more than enough charge to gate the Triac 40 into operation. Thus, the output pulses from the relaxation oscillator 38 operate as gate pulses to the gate of the Triac 40, and cause the Triac to energize the load 12 from the alternating current source 14. When the charge on the storage capacitor 24 has decayed to a level wherein the relaxation oscillator 18 ceases to operate, the Triac 40 is switched off to remove power from the load 12. This switch-off point, and therefore the time period during which power is provided to the load is determined by the adjustment of the variable resistor 32.

The electronic timer 10 provides timing cycles in the range of many minutes without resort to excessively large storage capacitors 24, for the circuit makes maximum use of the stored charge. It will be noted that the stored charge on the storage capacitor 24 is not employed continuously to provide the drive to the Triac 40.

As the charge on the storage capacitor 24 of the timer 10 decays, the frequency of the relaxation oscillator 18 is lowered, and in some instances erratic triggering of the Triac switch 40 may occur in the turnoff range. To eliminate this possible deficiency, an electronic timer 50 illustrated in FIG. 2 is designed to provide a constant voltage for driving a relaxation oscillator. It will be noted that the timer 50 of FIG. 2 contains the same major components as the circuit 10 of FIG. 1; namely, an energy source 16, a relaxation oscillator 18, and a switch unit 20 connected to a load 12. Circuit components in FIG. 2 which are identical to those in FIG. 1 will be given the same reference numerals for ease of description.

The electronic timer 50 is supplied from terminals **14*a* and 14*b* which feed the AC power line connected to the terminals of a 60-cycle 120-volt power source in the manner illustrated in FIG. 1. It will be noted that the energy source 16 of the timer 50 includes the normally open pushbutton switch 22, the storage capacitor 24, the diode 26 and the current limiting resistor 28 connected in series across the alternating current power supply in the manner described in connection with the timer 10. However, the energy source 16 of the timer 50 additionally includes a clamping circuit which consists of a diode 52, a resistor 54, a variable resistor or potentiometer 56, a diode 58, and a transistor 60. The anode of the diode 52 is connected to terminal 14*a*, and the diode is in turn connected in series with the resistors 54 and 56. One terminal of the variable resistor 56 is connected to the anode of the diode 58 which is also connected between the storage capacitor 24 and the push button switch 22. The cathode of the diode 58 is connected to the base of the transistor 60, and the transistor includes an emitter electrode which is connected to the terminal 14*b* and a collector electrode which is connected to the relaxation oscillator 18**.

In addition to the clamping circuit, the energy source 16 of the timer 50 also includes a power circuit for the relaxation oscillator consisting of a diode 62 and a filter capacitor 64 connected across the A.C. power line.

The relaxation oscillator 18 of the timer 50 includes a resistor 66 which is connected between the diode 62 and the capacitor 64 and also to a terminal point 68. Also connected to the terminal point 68 is the collector electrode of the transistor 60, one terminal of the small capacitor 34 and one terminal of the Diac trigger diode 38. It will be noted that the Diac 38 is connected between the terminal point 68 and the AC line extending from the terminal **14*b* and that the small capacitor 34 is connected to the gate of the Triac switch by a resistor 70. Also a gate resistor 72 is connected between the gate electrode of the Triac 40 and the AC line extending to the terminal 14*b***.

In the operation of the electronic timer 50, before the normally opened pushbutton switch 22 is momentarily closed and a timing cycle thereby initiated, a small bias signal sufficient to turn on the transistor 60 is provided by the diode 52, the resistors 54 and 56, the diode 58, and the capacitor 24. With the transistor 60 on, current flow through the diode 62, resistor 66, and transistor 60 clamps the Diac 38 and prevents oscillation of the relaxation oscillator 18, thereby precluding conduction by the Triac 40.

When the pushbutton switch 22 is momentarily depressed, the large storage capacitor 24 is rapidly charged to a minus potential (i.e. minus 150 volts) with respect to the A.C. line in the manner described in connection with the electronic timer 10. Since the base of the transistor 60 is connected through the diode 58 to the capacitor 24, the transistor 60 is now reverse biased and a constant driving voltage is provided to the relaxation oscillator 18 via the diode 62, the filter capacitor 64 and the resistor 66. This causes the relaxation oscillator to operate and provide gating pulses to the gate of the Triac 40.

The pushbutton switch 22 is only momentarily depressed, and once this switch is released, the capacitor 24 is charged in a positive direction due to the connection provided by the diode 52, the resistor 54, and the variable resistor 56. As the charge on the capacitor 24 passes through zero in a positive direction and acquires a positive value (i.e. 1 volt), the diode 58 and transistor 60 become forward biased and clamp the capacitor 24 at a small positive value. The transistor 60 now conducts to clamp the Diac 38 and remove the gating signal provided by the relaxation oscillator 18 to the gate of the Triac 40. The Triac 40 will then remove power from the load 12.

It will be noted that the time required to charge the capacitor 24 to a small positive value is determined by the setting of the variable resistor 56, and therefore this resistor setting determines the time during which the Triac 40 will permit energization of the load 12 from the alternating current power source. The charging of the storage capacitor 24 in a positive direction causes a constant voltage to drive the relaxation oscillator 18 and also results in the elimination of the non- linear (exponential) portion of the discharge cycle of the storage capacitor. Thus the variable resistor or potentiometer 56 can have a linear taper rather than a logarithmic taper and, since the voltage charge on the capacitor 24 passes very rapidly through zero, the turnoff of the Triac 40 is very rapid and smooth. The frequency of the relaxation oscillator can not vary toward the end of the timing cycle as might occur in the case of the relaxation oscillator of the electronic timer 10, and therefore erratic triggering of the Triac 40 is precluded.

We claim

1. An electronic timer for controlling the time period during which a load is energized from an alternating current power source comprising first storage capacitor means, switch means operable when closed to complete a circuit from said power source to cause said first storage capacitor means to charge from said power source to a first charge potential, oscillator means operable in response to the charging of said first storage capacitor means in excess of an oscillator activation potential to provide a pulse output signal, said oscillator means being operable for a period beginning when the charge on said first storage capacitor means exceeds said oscillator activation potential until said charge again passes through said oscillator activation potential, clamping circuit means connected to clamp said oscillator means in an inactive state when the charge on said first storage capacitor means does not exceed said oscillator activation potential, variable control means connected to control the duration of time required for the charge on said first storage capacitor means to vary from said first charge potential to said oscillator activation potential, and semiconductor switch means connected to control the energization of said load by said power source, said semiconductor switch means being connected to receive said pulse output signal and operating in response thereto to permit energization of said load.

2. The electronic timer of claim 1 wherein said oscillator means includes a relaxation oscillator including a second capacitor means of less capacity than said first storage capacitor means, said second capacitor means being connected to charge when the charge on said first storage capacitor means exceeds said oscillator activation potential to a potential sufficient to cause said relaxation oscillator to operate.

3. The electronic timer of claim 2 wherein said switch means and first storage capacitor means are connected in series across said alternating current power source.

4. The electronic timer of claim 3 wherein said semiconductor switch means includes a Triac connected in series with said load across said alternating current power source, said Triac including a gate electrode connected to receive the pulse output signal from said relaxation oscillator.

5. The electronic timer of claim 4 wherein said relaxation oscillator includes a Diac trigger diode connected to discharge said second capacitor means to provide the pulse output signal to said Triac gate electrode.

6. The electronic timer of claim 5 wherein said variable control means includes a variable resistor.

7. The electronic timer of claim 1 wherein said clamping circuit means operates to reverse charge said first storage capacitor means from said first charge potential through said oscillator activation potential when said switch means is opened subsequent to the charging of said first storage capacitor means to said first potential and constant voltage means is connected to provide a constant voltage to said oscillator means during the reverse charging of said first storage capacitor means until said clamping means is activated by the charge on said first storage capacitor means passing through said oscillator activation potential.

8. The electronic timer of claim 7 wherein said oscillator means includes a relaxation oscillator having a second capacitor means of less capacity than said first storage capacitor means and a Diac trigger diode connected to discharge said second capacitor means to provide said pulse output signal, said second capacitor means being connected to charge during the period that the charge on said first storage capacitor means is between said first potential and said oscillator activation potential, said clamping circuit means including a semiconductor means connected between said second capacitor means and said Diac trigger diode and operative when conductive to prevent operating voltage from operating said relaxation oscillator, and bias circuit means connected to cause conduction of said semiconductor means when said switching means is open and to prevent conduction of said semiconductor means when the charge on said first storage capacitor means exceeds said oscillator activation potential.

9. The electronic timer of claim 8 wherein said variable control means includes a variable resistor in said bias circuit means, said bias circuit means being connected to said first storage capacitor means to provide the reverse charging thereof.

10. An electronic timer for controlling the time period during which a load is energized from an alternating current power source comprising first storage capacitor means, means operable to complete a circuit from said power source for a time sufficient to cause said first storage capacitor means to charge from said power source to a first charge potential, semiconductor switch means connected to control the energization of said load by said power source, said semiconductor switch means being connected to receive a pulse output signal and operating in response thereto to permit energization of said load, and oscillator means operable in response to the charging of said first storage capacitor means in excess of an oscillator activation potential which is less than said first charge potential to provide a pulse output signal, said oscillator means being operable for a period beginning when the charge on said first storage capacitor means reaches said oscillator activation potential and including a second capacitor means of less capacity then said first storage capacitor means connected to charge from said first storage capacitor means during the period that the charge on said first storage capacitor means exceeds said oscillator activation potential and discharge means connected to repeatedly discharge said second capacitor means to provide said pulse output signal to said semiconductor switch means, said discharge means operating to discharge said second capacitor means when the charge potential thereon is sufficient to cause the operation of said semiconductor switch means.

11. The electronic timer of claim 10 wherein said semiconductor switch means includes a gate electrode connected to receive the pulse output signal from said oscillator means, said semiconductor switch means operating to permit energization of said load in response to pulse output signals of a potential which at least equals a gate potential required to initiate conduction of said semiconductor switch means, said second capacitor means operating to charge to a potential which is at last equal to said gate potential when the charge potential on said first storage capacitor means exceeds said oscillator activation potential and said discharge means operates to discharge said second capacitor means when the charge potential thereon is at least equal to said gate potential.

12. The electronic timer of claim 11 which includes variable control means connected to control the duration of time required for the charge on said first storage capacitor means to vary from said first charge potential to said oscillator activation potential.

* * * * *